(12) United States Patent
Tanzawa

(10) Patent No.: US 8,995,188 B2
(45) Date of Patent: Mar. 31, 2015

(54) SHARING SUPPORT CIRCUITRY IN A MEMORY

(71) Applicant: Micron Technology, Inc., Boise, ID (US)

(72) Inventor: Toru Tanzawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 161 days.

(21) Appl. No.: 13/864,733

(22) Filed: Apr. 17, 2013

(65) Prior Publication Data

US 2014/0313828 A1   Oct. 23, 2014

(51) Int. Cl.
*G11C 11/34* (2006.01)
*G11C 29/00* (2006.01)
*G11C 16/10* (2006.01)

(52) U.S. Cl.
CPC ..................................... *G11C 16/10* (2013.01)
USPC ................. 365/185.11; 365/200; 257/314

(58) Field of Classification Search
CPC ........ G11C 8/12; G11C 2213/71; G11C 8/10; G11C 13/0023
USPC ............ 365/51, 185.11, 185.13, 185.17, 191, 365/200; 257/314
See application file for complete search history.

(56) References Cited

U.S. PATENT DOCUMENTS

| | | | |
|---|---|---|---|
| 7,057,931 B2 | 6/2006 | Lutze et al. | |
| 7,898,317 B2 | 3/2011 | Choi | |
| 7,995,400 B2 | 8/2011 | Sarin | |
| 8,068,364 B2 | 11/2011 | Maejima | |
| 8,102,711 B2 | 1/2012 | Maejima | |
| 8,194,453 B2 | 6/2012 | Maejima | |
| 2006/0034137 A1* | 2/2006 | Zanardi | 365/200 |
| 2008/0023747 A1* | 1/2008 | Park et al. | 257/314 |
| 2009/0267128 A1 | 10/2009 | Maejima | |
| 2011/0069550 A1* | 3/2011 | Maejima | 365/185.11 |
| 2012/0147648 A1 | 6/2012 | Scheuerlein | |

* cited by examiner

*Primary Examiner* — Richard Elms
*Assistant Examiner* — Ajay Ojha
(74) *Attorney, Agent, or Firm* — Schwegman Lundberg & Woessner, P.A.

(57) ABSTRACT

A memory device, system, and method for operation of a memory device. In one such memory device, the memory device comprises a plurality of strings of memory cells. A plurality of drain select devices are coupled to each string of memory cells. An upper drain select device shares common support circuitry (e.g., selecting/deselecting transistors) with one or more upper drain select devices of other strings of memory cells. The support circuitry (e.g., selecting/deselecting transistors) for lower drain select devices can also be shared between a plurality of strings of memory cells.

25 Claims, 8 Drawing Sheets

| SUN-BLOCK i | SGDL m | SGDU m |
|---|---|---|
| SUN-BLOCK 0 | SGDL 0 | SGDU 0 |
| SUN-BLOCK 1 | SGDL 0 | SGDU 1 |
| SUN-BLOCK 2 | SGDL 0 | SGDU 2 |
| SUN-BLOCK 3 | SGDL 0 | SGDU 3 |
| SUN-BLOCK 4 | SGDL 1 | SGDU 0 |
| SUN-BLOCK 5 | SGDL 1 | SGDU 1 |
| SUN-BLOCK 6 | SGDL 1 | SGDU 2 |
| SUN-BLOCK 7 | SGDL 1 | SGDU 3 |

Fig. 8

SHARING SUPPORT CIRCUITRY IN A MEMORY

TECHNICAL FIELD

The present embodiments relate generally to memory and a particular embodiment relates to sharing support circuitry in a memory.

BACKGROUND

Flash memory devices have developed into a popular source of non-volatile memory for a wide range of electronic applications. Common uses for flash memory include personal computers, personal digital assistants (PDAs), digital cameras, digital media players, digital recorders, games, appliances, vehicles, wireless devices, cellular telephones, and removable memory modules. Flash memory devices typically use a one-transistor memory cell that allows for high memory densities, high reliability, and low power consumption. Changes in threshold voltage of the cells, through programming of a charge storage structure, such as floating gates, trapping layers or other physical phenomena, determine the data state of each cell.

The memory cells of a memory device are typically arranged in a memory array having a plurality of groups (e.g., blocks) that can be organized as series strings of memory cells. Support circuitry can be used to select an individual string of a number of strings of memory cells in a group of strings of memory cells in order to program, read, or erase a cell(s) of the selected string.

FIG. 1 illustrates typical prior art support circuitry 150, 151 for selecting and deselecting individual series strings of memory cells in respective selected and deselected memory blocks 100, 101. Since a number of memory blocks can share the same access lines (e.g., word lines) and data lines (e.g., bit lines), only the memory block that is being accessed for a particular memory operation (e.g., program, read, erase) should be selected.

FIG. 1 shows a memory block 100 that is selected for a particular memory operation (e.g., program, read, erase) and a memory block 101 that is deselected such that its memory cells are not affected by signals on the word lines WL0-WL32, bit line 110, and/or source 111. Each memory block 100, 101 is shown with two typical series strings 120-123 of memory cells that represent, for example, a plurality of series strings in each block (e.g., 0-15). Each series string 120-123 can be coupled to a respective drain select device 125-128 that can be used to selectively couple the respective series string to a bit line 110 responsive to a local drain select gate control signal SGD0-SGD15 and a respective source select device 130-133 that can be used to selectively couple the respective series string to the source 111 responsive to a local source select gate control signal SGS.

For purposes of clarity, the support circuitry 150, 151 shown represents the typical circuitry used for selectively coupling a single global word line GWL0 to a local word line WL0 and a single global drain select gate GSGD0 to a local drain select gate SGD0. For the selected block 100, a word line selecting transistor 103 and a drain select gate selecting transistor 105 are shown enabled by a high signal BLKSEL(n). A drain select gate deselecting transistor 106 is shown disabled by a low signal BLKSELb(n). Similarly, for the deselected block 101, a word line selecting transistor 107 and a drain select gate selecting transistor 108 are shown disabled by a low signal BLKSEL(n) while a drain select gate deselecting transistor 109 is shown enabled by a high signal BLKSELb(n).

It can be seen from FIG. 1 that each word line can be selected by one selecting/deselecting transistor 103, 107 and each drain select gate can be selected by two selecting/deselecting transistors 105, 108 and 106, 109 respectively. While it is not shown, the source select gates can also each use two selecting/deselecting transistors. Since a typical memory device might have hundreds of thousands of word lines and select gates, it can be appreciated that the support circuitry for the memory device can use a considerable amount of integrated circuit die real estate that might better be used by additional memory cells for greater memory density.

BRIEF DESCRIPTION OF THE DRAWINGS

FIG. 8 illustrates a table of sub-block decoding in accordance with the embodiment of FIG. 3C.

DETAILED DESCRIPTION

Figure 1:
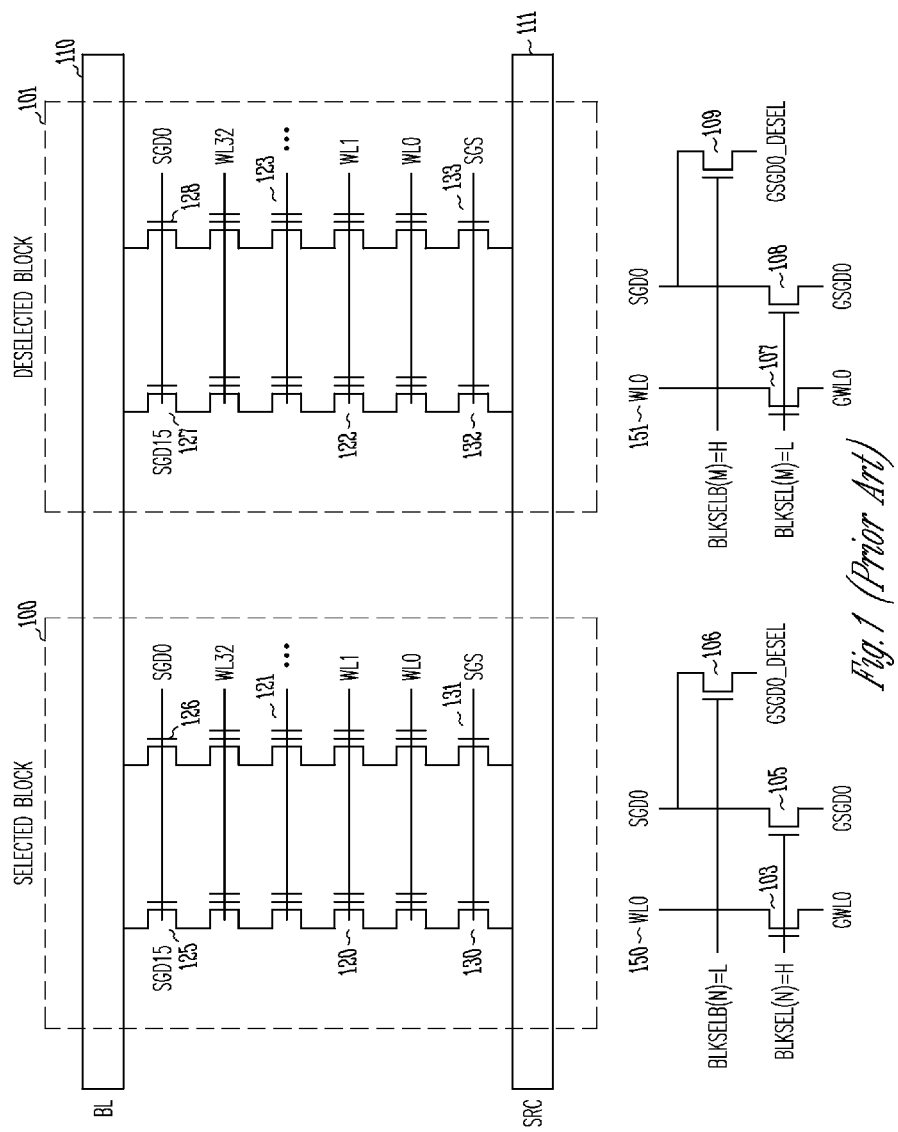
FIG. 1 illustrates a schematic diagram of typical prior art selected and deselected memory blocks with support circuitry.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Non-volatile memory can utilize different architectures including NOR and NAND. The architecture designation is derived from the logic used to read the devices. In NOR architecture, a logical column of memory cells is coupled in parallel with each memory cell coupled to a data line, such as those typically referred to as bit lines. In NAND architecture, a column of memory cells is coupled in series (e.g., drain to source) with only the first memory cell of the column coupled to a bit line.

Figure 2:
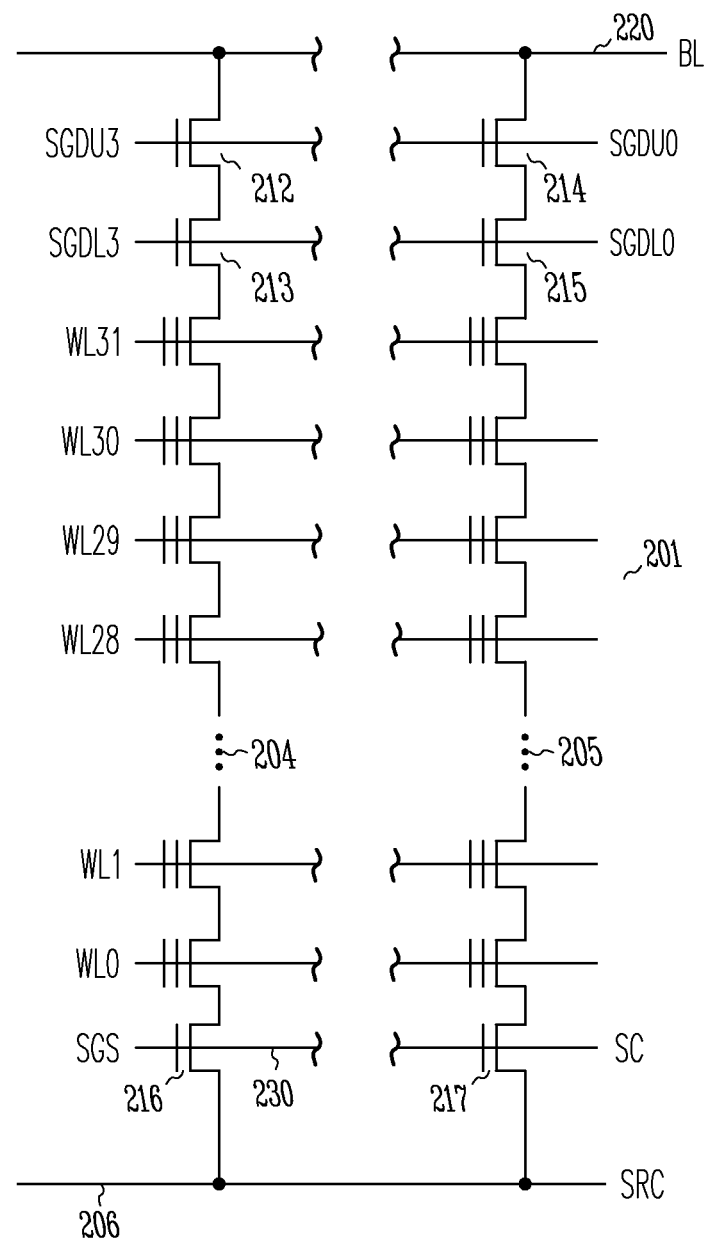
FIG. 2 illustrates a schematic diagram of one embodiment of a portion of a NAND architecture memory array.

FIG. 2 illustrates a schematic diagram of one embodiment of a portion of a block of a NAND architecture memory array 201 comprising series strings of non-volatile memory cells. The NAND architecture is for purposes of illustration only as the embodiments disclosed herein are not limited to any one memory architecture. In one embodiment, the memory array is formed as a three-dimensional architecture so that each memory cell of a series string can be formed in a different level along a vertical pillar of polysilicon.

The memory array 201 comprises an array of non-volatile memory cells (e.g., floating gate) arranged in columns such as series strings 204, 205. An access line (e.g., word line) WL0-WL31, that spans across multiple strings 204, 205, is coupled to the control gates of each memory cell in a row in order to bias the control gates of the memory cells in the row. A data line 220 (e.g., bit line BL) is coupled to the strings 204, 205 and eventually coupled to sense circuitry and page buffers (not shown) that detect and store the state of each cell by sensing current or voltage on a selected bit line.

Each string 204, 205 of memory cells is coupled to a source 206 by a source select device 216, 217 (e.g., transistor) and to an individual bit line 220 by at least two drain select devices 212, 213 and 214, 215 (e.g., transistors). The source select devices 216, 217 are controlled by a source select gate control signal SGS 230 coupled to their control gates. As will be described in greater detail subsequently, the drain select devices 212, 213 and 214, 215 are controlled by individual drain select gate control signals SGDU3, SGDL3 and SGDU0, SDGL0, respectively, coupled to their control gates.

In a typical programming of the memory array, each memory cell can be individually programmed as either a single level cell (SLC) or a multiple level cell (MLC). A cell's threshold voltage ($V_t$) can be used as an indication of the data stored in the cell. For example, in an SLC memory device, a $V_t$ of 2.5V might indicate a programmed cell while a $V_t$ of −0.5V might indicate an erased cell. In an MLC memory device, multiple $V_t$ ranges can each indicate a different state by assigning a bit pattern to a specific $V_t$ range.

The two strings 204, 205 of FIG. 2 can represent, for example, sixteen strings of a memory block. Each of the strings can be selected by two or more drain select devices (e.g., transistors). The embodiment of FIG. 2 shows an upper drain select device 212, 214 and a lower drain select device 213, 215 per string 204, 205. The upper drain select devices can be enabled by active upper drain select gate control signals SGDU0, SGDU3 and the lower drain select devices can be enabled by active lower drain select gate control signals SGDL0, SGDL3. Thus, an individual string can be selected when both the upper and lower drain select devices are enabled substantially simultaneously. Alternate embodiments might use greater quantities than the two drain select devices per string shown in FIG. 2.

To select, for example, the first string of memory cells 204 and deselect the second string of memory cells 205, the drain select gate control signals SGDU3 and SGDL3 for their respective drain select devices 212, 213 should both be active (e.g., a logical high signal if the drain select devices are nFET transistors) and the SGS signal should also be active.

Since the first string of memory cells 204 is selected, certain other strings of memory cells should be deselected to avoid being programmed, read, or erased by accident. Thus, string 205, and other deselected strings, can be deselected by having at least one of their respective select gate control signals SGDU or SGDL inactive (e.g., logical low). For example, in the embodiment of FIG. 2, the upper drain select device 214 might receive an inactive (e.g., low) SGDU0 signal while the lower drain select device 215 might receive an active or inactive (e.g., high or low) SGDL0 signal.

As is shown and described in greater detail subsequently, the shared support circuitry for enabling the drain select devices is shared between a plurality of strings of memory cells. For example, one embodiment might share support circuitry between two different drain select devices. In one embodiment, both of the drain select devices that share the support circuitry might be in the same memory block. In an alternate embodiment, a first of these drain select devices might be in a selected memory block while a second of these drain select devices can be in a deselected memory block. In such an embodiment, the global word line signals will not affect the memory cells in the deselected memory block during memory operations.

FIGS. 3A, 3B, and 3C illustrate one embodiment of a method for forming upper and lower drain select gates such that drain select devices can share support circuitry. For purposes of illustration, the embodiment of FIGS. 3A, 3B, and 3C illustrates forming only eight upper drain select gates and two lower drain select gates. This method can be extended for forming other quantities of upper and lower drain select gates.

FIG. 3A illustrates an upper conductor material 301 (e.g., conductively doped polysilicon, metal, etc.) that is formed over a lower conductor material 302 (e.g., conductively doped polysilicon, metal, etc.), such as where the upper and lower conductor materials are separated by a dielectric (e.g., oxide) layer. The lower drain select gates can be formed in the lower conductor material 302. The upper drain select gates can be formed in the upper conductor material 301. The conductor materials for the upper and lower portions 301, 302 are not required to be the same.

FIG. 3B illustrates forming the select gates in the upper 301 and lower 302 conductor materials. These materials can be etched to form fingers 310-317. Each finger 310-317 can correspond to a separate sub-block in a block of memory. The select gates illustrated in this figure and FIG. 3C illustrate eight upper select gates and two lower select gates that can be biased by six select gate control signals (e.g., SGDU0, SGDL0, SGDU2, SGDU1, SGDL1, and SGDU3) provided by six SGD selecting transistors.

FIG. 3C illustrates the forming of conductors (e.g., wires) over and orthogonal to the select gates to form a plurality of bit lines 330. As can be understood, the bits lines are vertically separated from the upper select gates in this embodiment by at least one dielectric material. The individual drain select gates are labeled as being coupled to signals SGDU0, SGDL0, SGDU2, SGDU1, SGDL1, and SGDU3. As described with reference to FIG. 3A, SGDU0, SGDU2, SGDU1, and SGDU3 are shown as being coupled to drain select gates that are formed from the upper material 301 while signals SGDL0 and SGDL1 are shown as being coupled to drain select gates that are formed from the lower material 302.

Additional conductors 331 can also be formed over and orthogonal to the select gates, and coupled to particular ones of the upper select gates in order to share the support circuitry between such gates. For example, in one embodiment, one upper select gate (corresponding to the finger 310 formed in the upper material 301) is coupled through one of the conductors 331 to another upper select gate (corresponding to the finger 314 formed in the upper material 301). With this conductor, the select gate control signal SGDU0 can be shared between the two upper drain select gates.

By sharing drain select gate control signals between select gates, as illustrated in the embodiment of FIG. 3C, the number of selecting transistors corresponding to a block of memory can be less than the number of drain select devices in the block of memory. This quantity is reduced from a typical prior art memory device where the number of selecting transistors corresponding to a block of memory is at least equal to the number of drain select devices in the block of memory.

FIG. 8 illustrates a table of sub-block decoding in accordance with the embodiment of FIG. 3C. As described previously, each finger 310-317 can correspond to a separate sub-block in a block of memory. The table of FIG. 8 shows eight sub-blocks 0-7, two lower select gate control signals SGDL0, SGDL1 and four upper select gate control signals SGDU0-

SGDU3. There are eight upper select gate devices and eight lower select gate devices as seen subsequently in FIG. 4. The table of FIG. 8 illustrates that one memory block of sixteen drain select gates can be decoded by using four upper select signals and two lower select signals.

The table of FIG. 8 shows, for example, that sub-block 0 can be enabled by select gate control signals SGDL0 and SGDU0 being active. Similarly, sub-block 1 can be enabled by select gate control signals SGDL0 and SGDU1 being active, sub-block 2 can be enabled by select gate control signals SGDL0 and SGDU2 being active, sub-block 3 can be enabled by select gate control signals SGDL0 and SGDU3 being active, sub-block 4 can be enabled by select gate control signals SGDL1 and SGDU0 being active, sub-block 5 can be enabled by select gate control signals SGDL1 and SGDU1 being active, sub-block 6 can be enabled by select gate control signals SGDL1 and SGDU2 being active, and sub-block 7 can be enabled by select gate control signals SGDL1 and SGDU3 being active.

When sub-block i (where i is any number from 0 to 7) is selected, the other sub-blocks are deselected because at least either one of upper or lower select gate device is grounded to disconnect BL from NAND string. In test modes, such as chip program and multi-block program, multiple sub-blocks can be selected as well. For example, when two lower select gate control signals and four upper gate control signals are made high during program operation, all the sub-blocks can be programmed to a same data. When two lower select gate control signals and even numbers of four upper gate control signals are made high during program operation, every other sub-block can be programmed to a same data or in a stripe pattern. Similarly, various data pattern can be programmed using a different decoding pattern in upper and lower select gate control signals.

Figure 3:
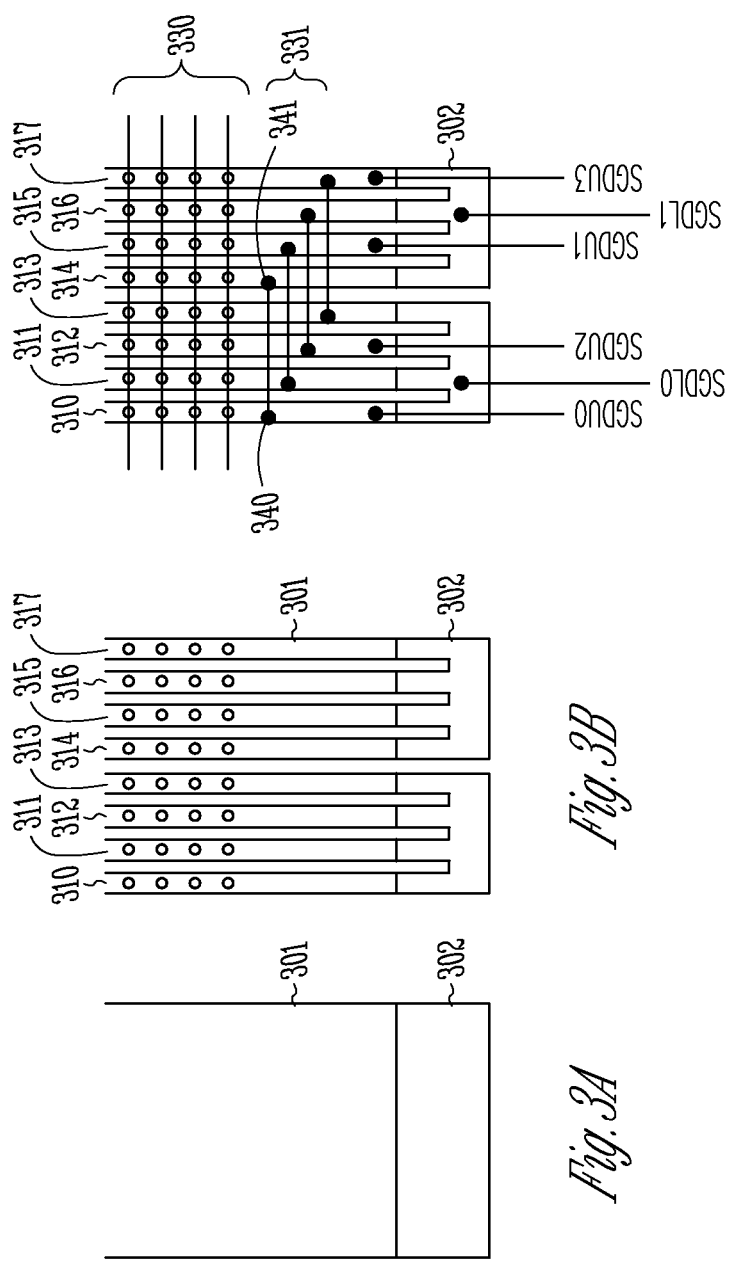
FIGS. 3A, 3B, and 3C illustrate one embodiment of fabrication steps for sharing support circuitry for select gates.
Figure 4:
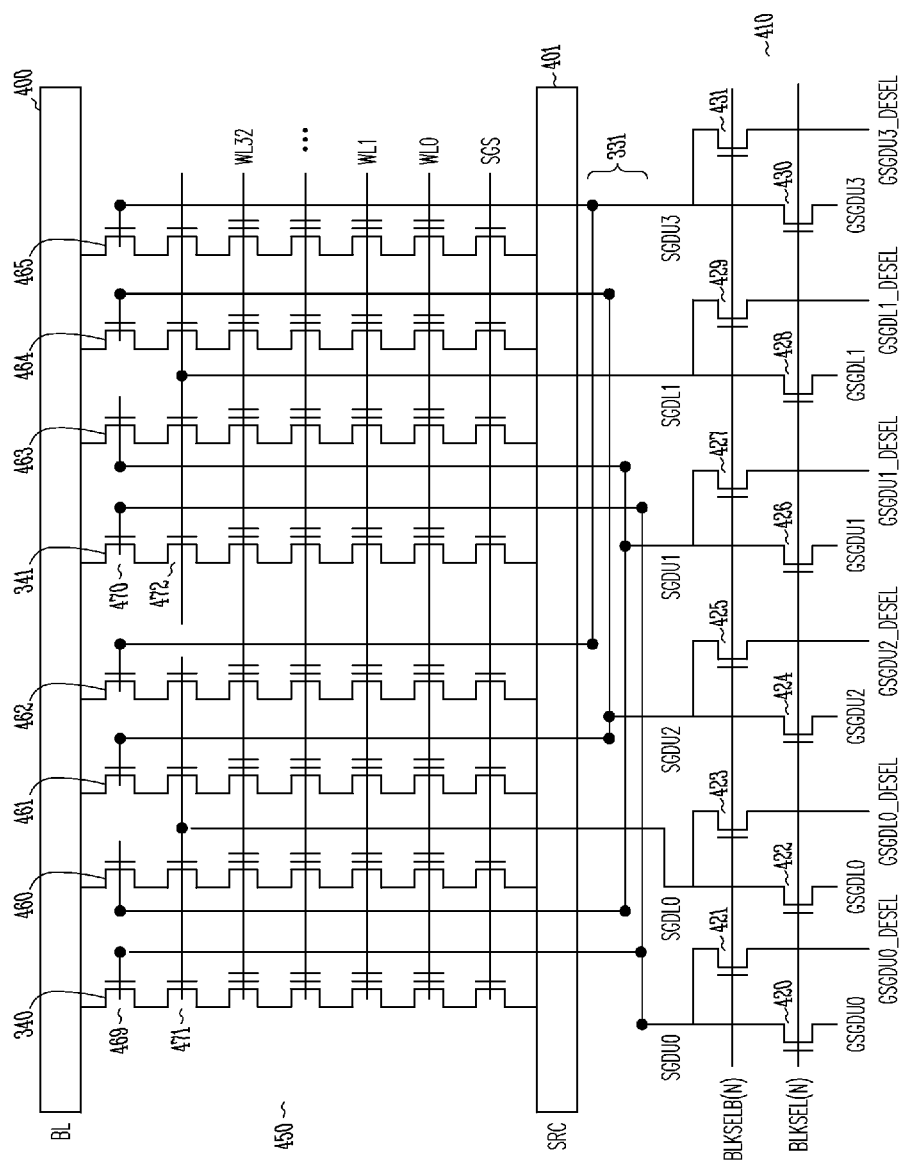
FIG. 4 illustrates a schematic diagram of one embodiment of a memory array with shared support circuitry that is shared between series strings in accordance with the embodiment of FIG. 3C.

FIG. 4 illustrates a schematic diagram of one embodiment of a portion of a block of memory 450 in accordance with the embodiment of FIG. 3C. FIG. 4 illustrates the connections between the upper drain select gates such that the shared support circuitry can be connected to at least two different upper drain select gates in a block.

FIG. 4 illustrates a bit line 400 to which each of the plurality of strings can be selectively coupled through their respective at least two drain select devices. This figure also illustrates a source 401 to which each of the plurality of strings can be selectively coupled through their respective source select devices responsive to the SGS signal.

The shared support circuitry 410 is shown as connected through the conductors 331 to their respective drain select gates. The shared support circuitry 410 can include the selecting/deselecting transistors 420-431.

In one embodiment, each selecting transistor 420, 422, 424, 426, 428, 430 can be used to selectively couple a global drain select gate control signal GSGDU0, GSGDL0, GSGDU2, GSGDU1, GSGDL1, GSGDU3 as a respective local drain select gate control signal SGDU0, SGDL0, SGDU2, SGDL1, SGDU3. Similarly, each deselecting transistor 421, 423, 425, 427, 429, 431 can be used to couple a global drain deselect gate control signal GSGDU0_desel, GSGDL0_desel, GSGDU2_desel, GSGDU1_desel, GSGDL1_desel, GSGDU3_desel as a respective local drain select gate control signal SGDU0, SGDL0, SGDU2, SGDL1, SGDU3 (e.g., selecting signals). In one embodiment, the global drain select gate control signals can be selectively coupled to a supply voltage (e.g., VCC) such that, when coupled to respective drain select gates, would enable the respective drain select devices. Also in one embodiment, the global drain deselect gate control signal is selectively coupled to a ground potential (e.g., 0V) such that, when coupled to respective drain select gates, would disable the respective drain select devices.

The selecting transistors 420, 422, 424, 426, 428, 430 are enabled by a memory block select enable signal BLKSEL(n) that is coupled to the gates of each selecting transistor. The deselecting transistors 421, 423, 425, 427, 429, 431 are enabled by the logical inverse signal BLKSELb(n) of the memory block select enable signal. This provides the selecting transistors 420, 422, 424, 426, 428, 430 with the ability to all be enabled when the deselecting transistors 421, 423, 425, 427, 429, 43 are disabled and the selecting transistors 420, 422, 424, 426, 428, 430 to be disabled when the deselecting transistors 421, 423, 425, 427, 429, 43 are enabled.

As seen in FIG. 4, the selecting/deselecting transistors 420, 421 for the local SGDU0 signal are shown coupled to the gates of upper drain select devices 469, 470 for a first 340 and a second 341 string. The selecting/deselecting transistors 422, 423 for the local SGDL0 signal are shown coupled to the gate of lower drain select device 471 for the first string 340 as well as the gates of the lower drain select devices for strings 460-462. However, as discussed subsequently, the local SGDL0 signal is not coupled to the gate of lower drain select device 472 for the second string 341.

In a similar fashion, the selecting/deselecting transistors 424, 425 for the local SGDU2 signal are shown coupled to the gates of upper drain select devices for two strings 461, 464. The selecting/deselecting transistors 426, 427 for the local SGDU1 signal are shown coupled to the gates of upper drain select devices for another two strings 460, 463. The selecting/deselecting transistors 428, 429 for the local SGDL1 signal are shown coupled to the gates of lower drain select devices for a plurality of strings 341, 463-465 The selecting/deselecting transistors 430, 431 for the local SGDU3 signal are shown coupled to the gates of upper drain select devices for yet another two strings 462, 465.

As one example of selecting a first string 340 for a memory operation, the enable signal BLKSEL(n) is at a positive voltage (e.g., logical high) to enable the selecting transistor 420 and BLKSELb(n) is at a ground voltage (e.g., logical low) to disable the deselecting transistor 421. The global drain select gate control signal GSGDU0 is thus allowed through as the local SGDU0 signal that is then used to bias the control gate of the upper drain select device 469 of the first string 340. The BLKSEL(n) also enables the selecting transistor 422 for the GSGDL0 signal while the BLKSELb(n) signal disables the deselecting transistor 423 so that the local SGDL0 signal can enable the lower drain select device 471 of the first string 340.

It can be seen that, even though the upper drain select device of the second string 341 coupled to the SGDU0 signal is enabled, the lower drain select device 472 for the second string 341 might not be enabled since it receives a different global drain select gate control signal GSGDL1. Thus, the second string 341 would not be enabled for memory operations until the lower drain select device 472 is enabled by the local SGDL1 signal.

Figure 5:
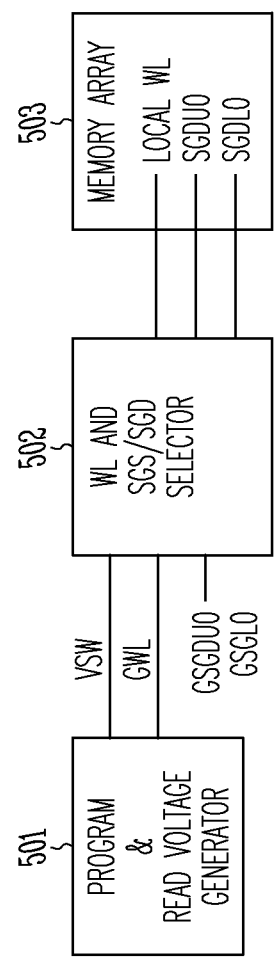
FIG. 5 illustrates a block diagram of one embodiment of a memory array with shared support circuitry in accordance with the embodiments of FIGS. 2-4.

FIG. 5 illustrates a block diagram of one embodiment of a memory array with support circuitry in accordance with the embodiments of FIGS. 2-4. This block diagram is for purposes of illustration only as other embodiments can be used to achieve substantially similar results.

A program and read voltage generator 501 can be used to generate the various voltages used for different memory operations. This generator 501 is shown generating the signal ($V_{SW}$) used for switching between different strings of memory cells. For example, this signal can be applied to switching circuitry to switch from one string to another once a particular memory operation has been completed. This generator 401 also generates the memory operation voltages applied to the global word line GWL that is switched amongst the local word lines by the support circuitry.

FIG. 5 also shows a word line and SGS/SGD selector circuit 502 coupled to the program and read voltage generator 401. The selector circuit 502 can be configured to switch the global word line GWL amongst the local word lines. The selector circuit 502 can also be configured to switch the global upper drain select gate control signals amongst the local upper drain select gate control signals and the global lower drain select gate control signals amongst the local lower drain select gate control signals.

A memory array 503 is coupled to the word line and SGS/SGD selector circuit 502 through the switched local word lines and the switched local drain select gate lines (e.g., SGDU0, SGDL0). The memory array 503 can use the embodiments of FIGS. 2 and 3.

Figure 6:
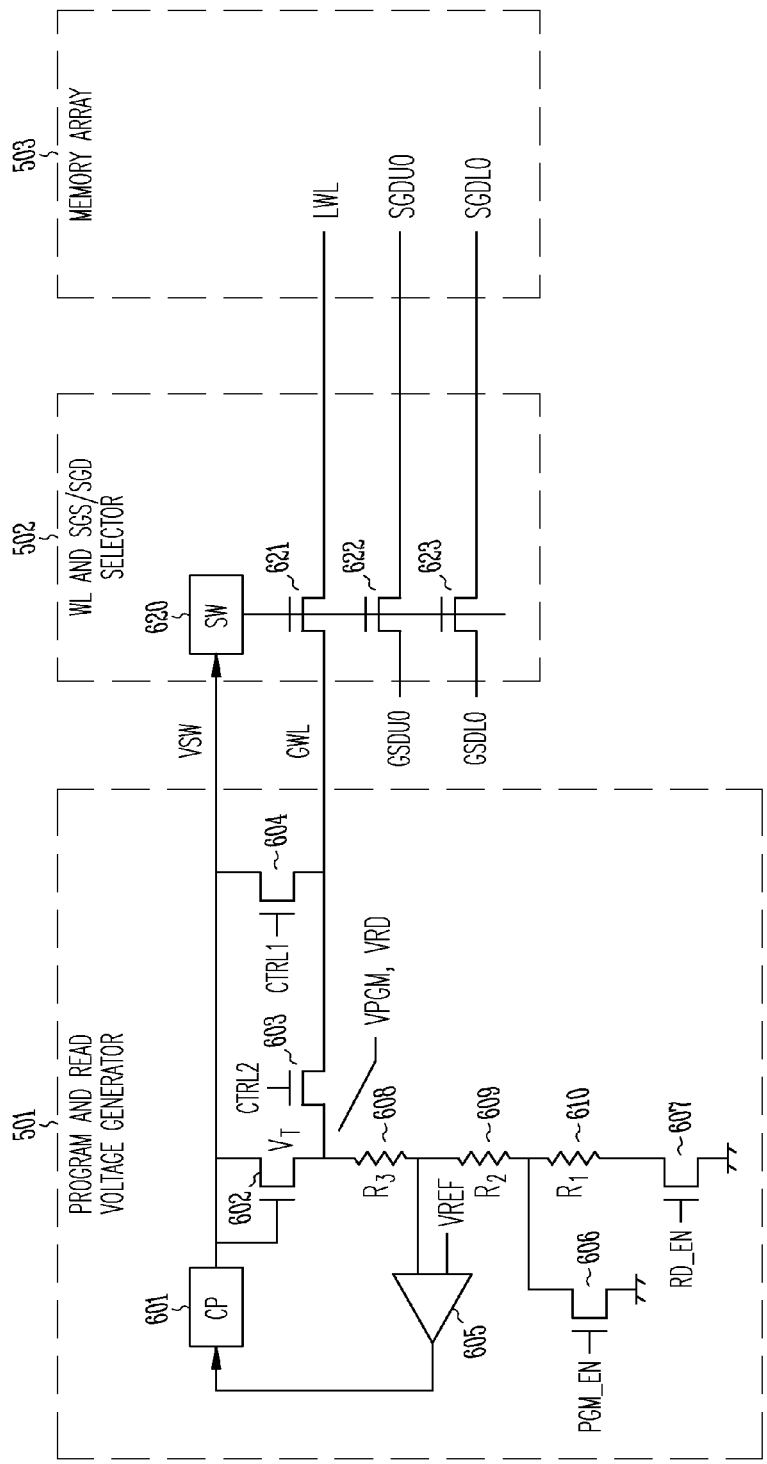
FIG. 6 illustrates a schematic diagram of one embodiment of an implementation of the embodiment of FIG. 5.

FIG. 6 illustrates a schematic diagram of one embodiment of an implementation of the embodiment of FIG. 5. The implementation of FIG. 6 is only one way to implement the block diagram of FIG. 5. Alternate embodiments can use other circuits to achieve substantially the same results.

The program and read voltage generator 501 is shown using a charge pump CP 601 to generate a voltage. The voltage is adjusted by an operational amplifier 605 that is coupled to the CP 601 and has inputs of $V_{ref}$ and the voltage at the node between R2 609 and R3 608. Resistors R1, R2, and R3 610, 609, 608 are coupled together in series and one end of R1 610 is coupled to the drain of transistor 607 that receives the control signal RD_EN on its gate. The source of the transistor 607 is coupled to a ground connection. The drain of a program voltage enable transistor 606 is coupled to the node between the R2 609 and R1 610 resistors. The source of transistor 606 is coupled to the ground connection.

The drain and gate of a source follower transistor 602 are coupled to an output of the CP 601 and to a $V_{SW}$ output of the voltage generator 501. The source of the source follower transistor 602 is coupled to a global word line GWL output of the voltage generator 501 through a control transistor 503. Another control transistor 504 is coupled between the $V_{SW}$ and the GWL outputs of the voltage generator 401.

During a read operation, the RD_EN control signal can go to a first state (e.g., logical high) and the PGM_EN control signal go to a second state (e.g., logical low) to indicate the read operation is in progress. This is an indication to the voltage generator to generate a read voltage. The read voltage $V_{rd}$ is then substantially equal to $(1+R3/(R1+R2))V_{ref}$. During a program operation, PGM_EN can go to the first state (e.g., logical high) and RD_EN can go to the second state (e.g., logical low) to indicate the program operation is in progress. The program voltage $V_{pgm}$ is then substantially equal to $(1+R3/R2)V_{ref}$. By adjusting the resistance values of R1, R2, and R3 610, 609, and 608, the voltages for $V_{pgm}$ and $V_{rd}$ can be adjusted (e.g., $V_{pgm}$=20V and $V_{rd}$=2V). The switching voltage $V_{SW}$ can be substantially equal to $V_{pgm}$ (or $V_{rd}$)+$V_t$ (e.g., threshold voltage of transistor 602).

When a positive voltage (e.g., logically high signal) is used to bias the control gate of transistor 504, this transistor turns on and shorts the $V_{SW}$ output to the GWL output of the voltage generator. Thus, during a period when an output current is needed to increase a word line current to the local word lines LWL, both of the CTRL1 and CTRL2 control signals can be at a positive voltage (e.g., logically high) to turn on their respective transistors 604, 603. As a result, this control method can increase the local word line current in shorter time than the case where there is no transistor as 504 because of the higher drive current. Once the comparator 605 detects that the output voltage $V_{pgm}$ ($V_{rd}$) reaches a target voltage, a control circuit (which is not shown in figures) controls CTRL1 to be low so that the transistor 504 is disconnected. When CTRL1 is at a ground voltage (e.g., logically low) and CTRL2 is at a positive voltage (e.g., logically high), one transistor 604 is turned off while the other transistor 603 is turned on. Thus, the voltage generator 501 outputs a $V_{SW}$ voltage on the $V_{SW}$ output in the former period and a program or read voltage (depending on the memory operation) on the GWL output in the latter period to reduce the LWL rise time.

A word line and SGS/SGD selector circuit 502 comprises a switch circuit 620 that is coupled to the switching voltage $V_{SW}$ from the voltage generator 501. The switching circuit 620 can be used to bias control gates of support circuitry selecting transistors 621-623 that can be used to transfer the global word line (GWL) and global drain select gate control signals (GSGD) to local word line (LWL) and local drain select gate control signals (SGDU0 and SGDL0).

The memory array 503 can comprise an array of memory cells as previously discussed as well as the select devices (e.g., drain select devices and source select devices). The memory array further comprises the local word lines LWL and the local select gate control signals (e.g., SGDU0, SGDL0).

Figure 7:
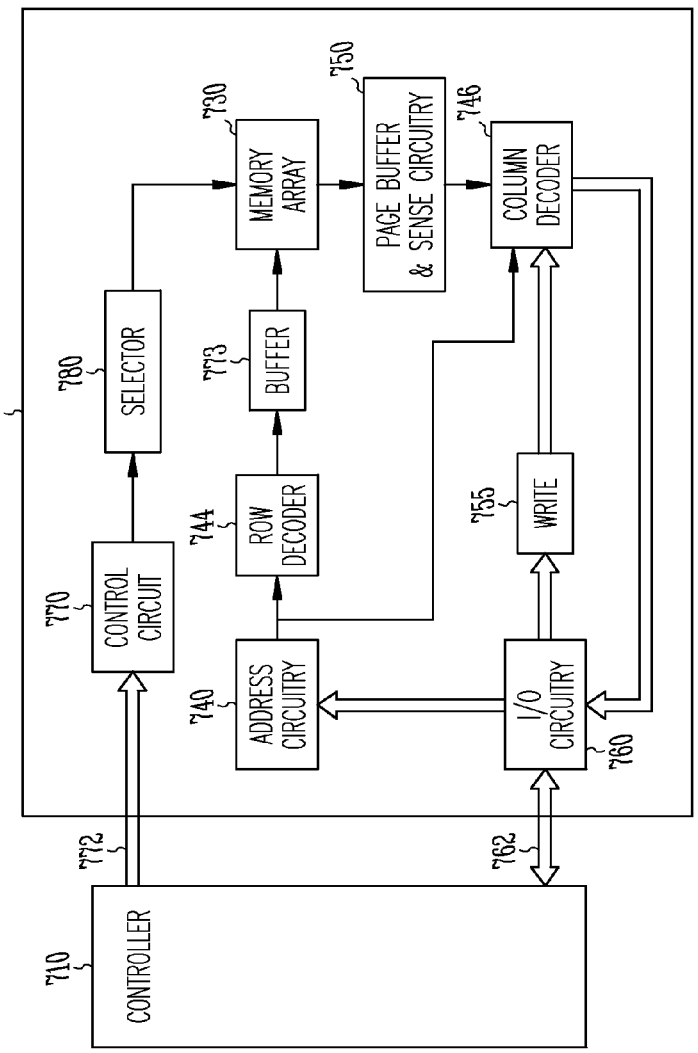
FIG. 7 illustrates a block diagram of one embodiment of a system.

FIG. 7 illustrates a functional block diagram of a memory device 700 that can comprise a memory array architecture such as illustrated in FIG. 2. The memory device 700 is coupled to an external controller 710 (e.g., microprocessor). The external controller 710 can be configured to transmit commands (e.g., write, read) and control signals to the memory device 700. The memory device 700 and the external controller 710 form part of a system 720.

The memory device 700 includes an array 730 of memory cells (e.g., NAND architecture non-volatile memory cells). The memory array 730 is arranged in banks of word line rows and bit line columns. In one embodiment, the columns of the memory array 730 can comprise strings of memory cells.

Address buffer circuitry 740 is provided to latch address signals provided through I/O circuitry 760 from the external controller 710. Address signals are received and decoded by a row decoder 744 and a column decoder 746 to access the memory array 730. A row buffer 773 can be used to buffer data prior to input to the memory array 730.

The memory device 700 reads data in the memory array 730 by sensing voltage or current changes in the memory array columns using sense circuitry/page buffers 750. The sense circuitry/page buffers 750 are coupled to read and latch a row of data from the memory array 730. Data are input and output through the I/O circuitry 760 for bidirectional data communication as well as the address communication over a plurality of data connections 762 with the controller 710. Write circuitry 755 is provided to write data to the memory array.

Control circuitry 770 decodes signals provided on a control interface 772 from the external controller 710. These signals are used to control the operations of the memory array 730, including data sense (e.g., read), data write (e.g., program), and erase operations. The control circuitry 770 may be a state machine, a sequencer, or some other type of control circuitry that is configured to control generation of memory control signals. In one embodiment, the control circuitry 770 is configured to control a selector circuit 780 (e.g., supporting circuitry, selecting/deselecting transistors) that is coupled to the memory array 730 as described previously.

CONCLUSION

One or more embodiments use a plurality of drain select devices coupled to each string of memory cells. An upper drain select device shares common support circuitry (e.g., selecting/deselecting transistors) with one or more upper drain select devices of other strings of memory cells. The support circuitry (e.g., selecting/deselecting transistors) for lower drain select devices can also be shared between a plurality of strings of memory cells.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. A memory device comprising:
a group of memory, wherein the group of memory comprises:
a number of drain select devices; and
a number of strings of memory cells configured to be selectively coupled to a common source, wherein each of the number of strings of the group is coupled to a respective plurality of the number of drain select devices; and
support circuitry corresponding to the group, wherein the support circuitry corresponding to the group is configured to select an individual string of the number of strings and wherein the support circuitry comprises:
a number of selecting transistors coupled to the number of drain select devices, wherein the number of selecting transistors is less than the number of drain select devices.

2. The memory device of claim 1 wherein the support circuitry further comprises a number of deselecting transistors coupled to the number of drain select devices, wherein the number of deselecting transistors is less than the number of drain select devices.

3. The memory device of claim 1 wherein the number of drain select devices comprises a number of upper drain select devices and a number of lower drain select devices, wherein each of the number of strings of the group is coupled to a respective upper drain select device of the number of upper drain select devices and a respective lower drain select device of the number of lower drain select devices.

4. The memory device of claim 3, wherein the number of selecting transistors comprises a number of upper drain select gate selecting transistors and a number of lower drain select gate selecting transistors.

5. The memory device of claim 4, wherein the number of upper drain select gate selecting transistors is greater than the number of lower drain select gate selecting transistors.

6. The memory device of claim 5 wherein the number of upper drain select gate selecting transistors is twice the number of lower drain select gate selecting transistors.

7. The memory device of claim 1 wherein each of the number of selecting transistors is configured to selectively provide a respective one of a number of drain select gate control signals, wherein the number of drain select gate control signals is less than the number of drain select devices of the group.

8. The memory device of claim 1, wherein the group of memory comprises a block of memory.

9. The memory device of claim 1, wherein the group of memory comprises at least two blocks of memory, wherein an individual selecting transistor of the number of selecting transistors is coupled to:
a drain select device coupled to a string in a first block of the at least two blocks; and
a drain select device coupled to a string in a second block of the at least two blocks.

10. A memory device comprising:
a first string of memory cells coupled to a plurality of drain select devices; and
a second string of memory cells coupled to a plurality of drain select devices,
wherein at least one of the plurality of drain select devices coupled to the first string of memory cells shares common support circuitry with at least one of the plurality of drain select devices of the second string of memory cells.

11. The memory device of claim 10 wherein the common support circuitry comprises a selecting transistor.

12. The memory device of claim 11 wherein the common support circuitry further comprises a deselecting transistor.

13. The memory device of claim 10 wherein at least one of the plurality of drain select devices coupled to the first string of memory cells sharing common support circuitry with at least one of the plurality of drain select devices of the second string of memory cells comprises an upper drain select device coupled to the first string of memory cells sharing the common support circuitry with an upper drain select device coupled to the second string of memory cells.

14. The memory device of claim 13, wherein the plurality of drain select devices coupled to the first string of memory cells further comprises a lower drain select device, and wherein the memory device further comprises a third string of memory cells coupled to an upper drain select device and a lower drain select device, wherein the lower drain select device coupled to the third string of memory cells shares common support circuitry with the lower drain select device coupled to the first string of memory cells.

15. The memory device of claim 14, wherein the plurality of drain select devices coupled to the second string of memory cells further comprises a lower drain select device, and wherein the lower drain select device coupled to the second string of memory cells does not share common support circuitry with the lower drain select device coupled to the first string of memory cells.

16. A system comprising:
a controller; and
a memory device coupled to the controller, the memory device comprising:
a plurality of strings of memory cells, each of the plurality of strings of memory cells comprising a plurality of drain select devices and a source select device wherein at least one of the plurality of drain select devices of a first set of strings of memory cells of the plurality of memory cells shares common support circuitry with at least one of the plurality of drain select devices of a second set of strings of memory cells of the plurality of memory cells.

17. The system of claim 16 wherein the support circuitry comprises selecting transistors.

18. The system of claim 17 wherein the support circuitry further comprises deselecting transistors.

19. The system of claim 17 wherein the selecting transistors are configured to select an individual string of the plurality of strings of memory cells and further wherein the number of selecting transistors is less than the number of drain select devices in each of the plurality of series strings.

20. A method for operation of a memory device comprising a group of memory cells organized as strings of memory cells each having a plurality of drain select devices, the method comprising:
    selecting an individual string of memory cells of the strings of memory cells in response to activating all of the plurality of drain select devices in the individual string of memory cells with support circuitry comprising a number of selecting transistors coupled to the plurality of drain select devices, wherein the number of selecting transistors is less than the number of drain select devices.

21. The method of claim 20 and further comprising a first of the number of selecting transistors enabling a first of the plurality of drain select devices in each of a plurality of the strings of memory cells.

22. The method of claim 21 and further comprising a second of the number of selecting transistors enabling a second of the plurality of drain select devices in each of the plurality of strings of memory cells.

23. The method of claim 20 wherein the support circuitry further comprises deselecting transistors and the method further comprises deselecting unselected ones of the strings of memory cells in response to the deselecting transistors.

24. The method of claim 23 wherein deselecting the unselected ones of the strings of memory cells with the deselecting transistors that number less than the number of drain select devices.

25. The method of claim 20 and further comprising the support circuitry selecting a source select device in each of the strings of memory cells.

\* \* \* \* \*